US011290119B1

(12) United States Patent
Reindl et al.

(10) Patent No.: US 11,290,119 B1
(45) Date of Patent: Mar. 29, 2022

(54) OFFSET SWITCHING TO PREVENT LOCKING IN CONTROLLED OSCILLATOR ANALOG-TO-DIGITAL CONVERTERS

(71) Applicant: Infineon Technologies AG, Neubiberg (DE)

(72) Inventors: Christian Reindl, Villach (AT); Andreas Wiesbauer, Poertschach (AT); Pedro Augusto Borrego Lambin Torres Amaral, Villach (AT); Luis Hernandez, Madrid (ES); Andres Quintero Alonso, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/072,543

(22) Filed: Oct. 16, 2020

(51) Int. Cl.
   *H03M 1/12* (2006.01)
   *H03M 1/06* (2006.01)
   *H03K 3/03* (2006.01)

(52) U.S. Cl.
   CPC ........ *H03M 1/0617* (2013.01); *H03K 3/0315* (2013.01)

(58) Field of Classification Search
   CPC .......................... H03M 1/0617; H03K 3/0315
   USPC .......................................... 341/118, 120, 155
   See application file for complete search history.

(56) References Cited

U.S. PATENT DOCUMENTS

| 5,052,028 A * | 9/1991 | Zwack | H04J 3/0688 |
| | | | 375/358 |
| 2014/0270261 A1* | 9/2014 | Wiesbauer | H03M 1/12 |
| | | | 381/111 |

OTHER PUBLICATIONS

Grollitsch, W., et al., "A 1.4psrms-Period-Jitter TDC-Less Fractional-N Digital PLL with Digitally Controlled Ring Oscillator in 65nm CMOS", ISSCC Dig. Tech, papers, Feb. 2010, 3 pages.
Rylyakov, A. V., et al., "A Wide Power-Supply Range (0.5V-to-1.3V) Wide Tuning Range (500 MHz-to-8 GHz) All-Static CMOS ADPLL in 65nm SOI", ResearchGate, Digest of Technical Papers, IEEE International Solid-State Circuits Conference, Mar. 2007, 25 pages.

* cited by examiner

*Primary Examiner* — Peguy Jean Pierre
(74) *Attorney, Agent, or Firm* — Slater Matsil, LLP

(57) ABSTRACT

A controlled oscillator Analog-to-Digital Converter (ADC) includes an analog interface configured for receiving an analog differential input signal, and configured for providing a differential control signal; first and second controlled oscillators configured for receiving the differential control signal; and a frequency-to-digital converter having a first input coupled to an output of the first controlled oscillator, a second input coupled to an output of the second controlled oscillator, and an output for providing a digital output signal proportional to the analog differential input signal, wherein the analog interface or at least one of the first and second controlled oscillators is configured for receiving at least one disturb signal to prevent locking between the first and second controlled oscillators.

20 Claims, 15 Drawing Sheets ical field

The present invention relates generally to a circuit, system, and method for offset switching to prevent locking in controlled oscillator analog-to-digital converters.

BACKGROUND

In some circuits, such as voltage-controlled oscillator (VCO) analog-to-digital converters (ADCs), two voltage-controlled oscillators can be used having a similar or the same free-running frequency during at least some modes of operation. The two controlled oscillators can be fabricated together on a single integrated circuit. In a VCO ADC, the frequencies of the oscillators are modulated by an input signal, such as a differential input signal. Depending on the value of the input signal, the output signal frequencies of the two oscillators can be close or even equal. If there is coupling between the two oscillators, such as parasitic coupling or vibrational coupling, the operation of the two oscillators can lock together for at least a period of time. Consequently, the output code of the VCO ADC can become stuck for at least a period of time at a fixed value not necessarily related to the input signal value. This, in turn, can lead to errors in the output code of the VCO ADC as well as increased output noise.

SUMMARY

In an embodiment, a controlled oscillator Analog-to-Digital Converter (ADC) includes an analog interface configured for receiving an analog input signal, and configured for providing a control signal; first and second controlled oscillators configured for receiving the control signal; and a frequency-to-digital converter having a first input coupled to an output of the first controlled oscillator, a second input coupled to an output of the second controlled oscillator, and an output for providing a digital output signal proportional to the analog input signal, wherein the analog interface or at least one of the first and second controlled oscillators is configured for receiving at least one disturb signal to prevent locking between the first and second controlled oscillators.

In an embodiment, a circuit including an analog interface comprising a first transistor having a control terminal for receiving a first input signal and a controlled terminal for providing a first control signal, and a second transistor having a control terminal for receiving a second input signal and a controlled terminal for providing a second control signal; a first controlled ring oscillator having a first input for receiving the first control signal and a first output for providing a first output signal; and a second controlled ring oscillator having a second input for receiving the second control signal and a second output for providing a second output signal, wherein the analog interface or at least one of the first and second controlled ring oscillators is configured for receiving at least one disturb signal to prevent locking between the first and second controlled ring oscillators.

In an embodiment, a method of operating a converter including two controlled oscillators includes receiving an analog input signal at a input of the converter; providing a digital output signal proportional to the analog input signal at an output of the converter; and providing at least one disturb signal to an analog interface of the converter or to at least one of the two controlled oscillators to prevent locking of the two controlled oscillators.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
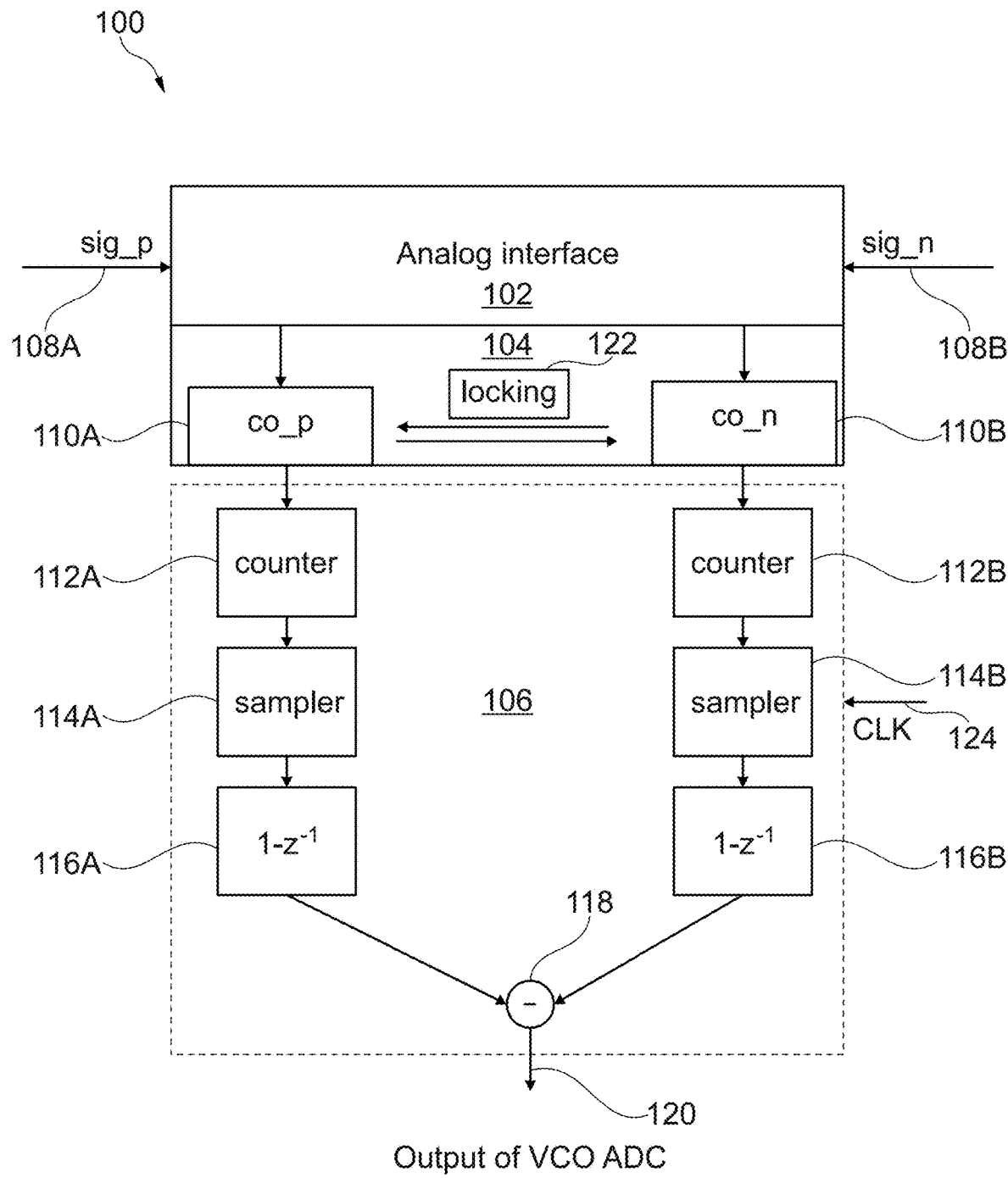
FIG. 1 is a block diagram of an exemplary controlled oscillator ADC.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

According to embodiments, adding disturb signals to the ADC causes an offset to occur between the output signals of the controlled oscillators. The offset, in turn, causes the two controlled oscillators to oscillate on the same frequency in an overlapping manner for only for a short period of time. The short overlap time at the same frequency prevents locking of the two controlled oscillators. Advantages of some embodiments include the ability to prevent locking between VCOs in environments in which there is at least some coupling between the two VCOs. This may advantageously lead to reduced layout space and reduce costs compared to systems that only relay on layout techniques to isolate the VCOs from each other.

In various embodiments, a controlled oscillator ADC includes an analog interface for controlling two controlled oscillators and a frequency-to-digital converter. The analog interface receives an analog differential input signal or a single-ended input signal and controls the two controlled oscillators with either voltage or current control signals. A frequency-to-digital converter receives the control signals from the controlled oscillator and outputs a digital output signal representative of the analog differential input signal or the single-ended input signal. In embodiments, the analog interface or one of the two controlled oscillators receive the disturb signals to create the offset between the two output signals of the controlled oscillators that prevents injection locking during operation.

In various embodiments, the analog interface can include two current sources and a switch offset current for controlling two current-controlled oscillators. In other embodiments, the analog interface can include two transistors for controlling two voltage-controlled oscillators and the offset is generated by adding the disturb signal to the analog differential input signal. In other embodiments, the analog interface can include a variable or programmable resistor for receiving the disturb signal and for generating a voltage offset. In other embodiments, the voltage-controlled oscillators can include a varactor for receiving the disturb signal and for generating a voltage offset. In other embodiments, the voltage-controlled oscillators can include a variable or programmable transconductance for receiving the disturb signal and for generating a voltage offset. If desired, the controlled oscillator ADC according to embodiments can be used in a system including a processor, a driver circuit, as well as other components such as digital and analog signal processing components and MicroElectroMechanical Systems (MEMS) sensors.

FIG. 1 is a block diagram of an exemplary VCO ADC 100 that converts an analog differential input signal (sign_p–sig_n) at input nodes 108A and 108B into a digital output signal at node 120. VCO ADC 100 includes an analog interface 102, which converts the differential input signal into a control signal for controlled oscillators co_p 110A and co_n 110B in controlled oscillator portion 104. In a mode of operation, particularly when the output signals of oscillators 110A and 110B are at the same or a similar frequency, the oscillators can be locked through a locking mechanism 122. The locking mechanism can include parasitic coupling or vibrational coupling on an integrated circuit.

The outputs of the controlled oscillators 110A and 110B are coupled to a frequency-to-digital converter 106 that is coupled to output node 120 for providing a converted digital version of the analog differential input signal. The first stages at the oscillator output in the frequency-to-digital converter 106 are a pair of counters 112A and 112B (which in terms of analog signal processing represents a "1/s" element, which is an integrator). Counters 112A and 112B discretely measure the phase phi(t) of the controlled oscillators 110A and 110B since the outputs of the controlled oscillators are already digitized. The output of the counters 112A and 112B is sampled (latched) at fixed time instants by a pair of samplers 114A and 114B. In embodiments, a sampling rate of 768 kHz, 800 kHz, 1 MHZ, 1.5036 MHz, 2.4 MHz, 3.072 MHZ, and 4.8 MHz can be used. Other frequency sampling rates can also be used. The outputs of samplers 114A and 114B provides two N-bit coded digital streams of values at the sampling clock rate. In an embodiment, the samplers 114A and 114B can be a latch or flip-flop for taking a snapshot of the digital counter value. In some embodiments, the counter operation is asynchronous with the sampling clock (i.e., the counters 112A and 112B are operated with the modulated frequency of the controlled oscillators 110A and 110B). Each "1-$z^{-1}$" block 116A and 116B is a digital filter that calculates the difference of two consecutive values of an input digital data stream from samplers 114A and 114B. Effectively, the difference between the two consecutive values represents the change of the oscillator phase within a given period of time, which is a measure of the momentary frequency of the oscillator (and therefore the digitized version of the oscillator input signal). The output of the two blocks 116A and 116B is subtracted by a subtractor block 118 to provide the digital output signal at node 120. The sampling clock fsample can be derived from the system clock CLK 124 and is provided to the samplers 114A and 114B and all the consecutive blocks in embodiments. In an embodiment the sampling clock and the system clock can also have the same frequency.

Figure 2:
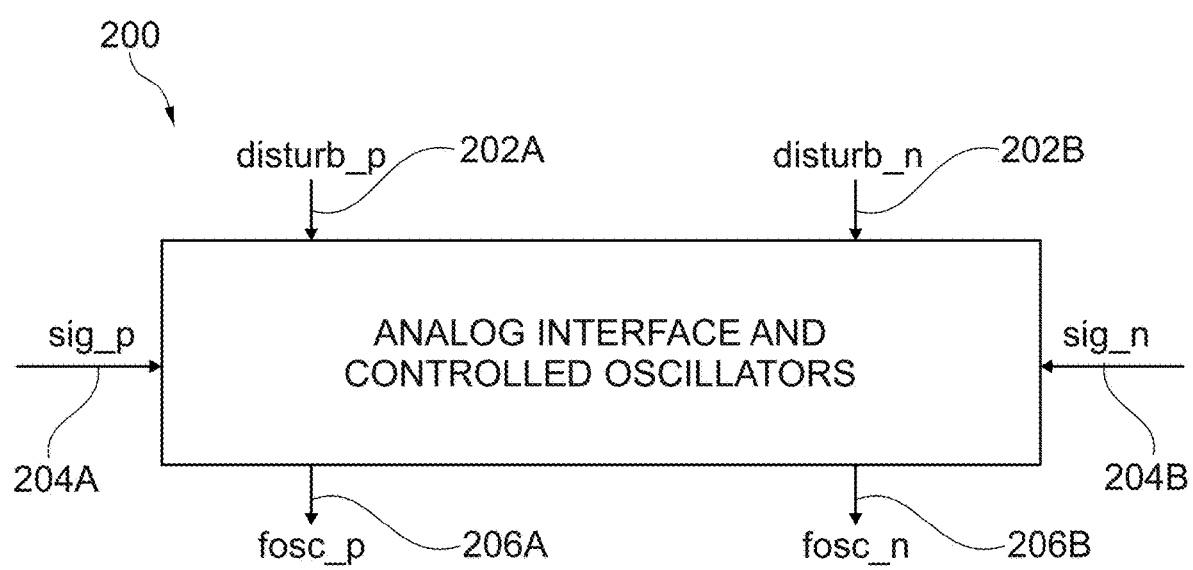
FIG. 2 is a block diagram of an analog interface and controlled oscillators for a controlled oscillator ADC according to an embodiment.

FIG. 2 is a block diagram of an analog interface and controlled oscillators 200 for a controlled oscillator ADC according to an embodiment. The frequency-to-digital converter is therefore omitted in FIG. 2. The analog differential input signal (sig_p–sig_n) at nodes 204A and 204B has been previously described. The outputs of the controlled oscillators are designated fosc_p and fosc_n at nodes 206A and 206B, which have also been previously described. In addition to the analog differential input signal, and the outputs of the controlled oscillators, analog interface and controlled oscillators 200 includes first and second disturb signals disturb_p and disturb_n received at nodes 202A and 202B. Disturb signals disturb_p and disturb_n are used to prevent locking between the controlled oscillators through various mechanisms associated with the analog interface or controlled oscillators and will be described in further detail below.

The operation of the analog interface and controlled oscillators 200 can be described with reference to the following equations, wherein:

$$fosc\_p = fo\_p + k1*sig\_p + k2*disturb\_p;$$

$$fosc\_n = fo\_n + k1*sig\_n + k3*disturb\_n;$$

fo_p, fo_n are the free-running frequencies of the controlled oscillators;
sig_p–sig_n is the differential input signal;
k1, k2, k3 are arbitrary constants;
disturb_p, disturb_n are switched or static signals; and
fosc_p, fosc_n are the frequencies of the controlled oscillators.

Figure 3:
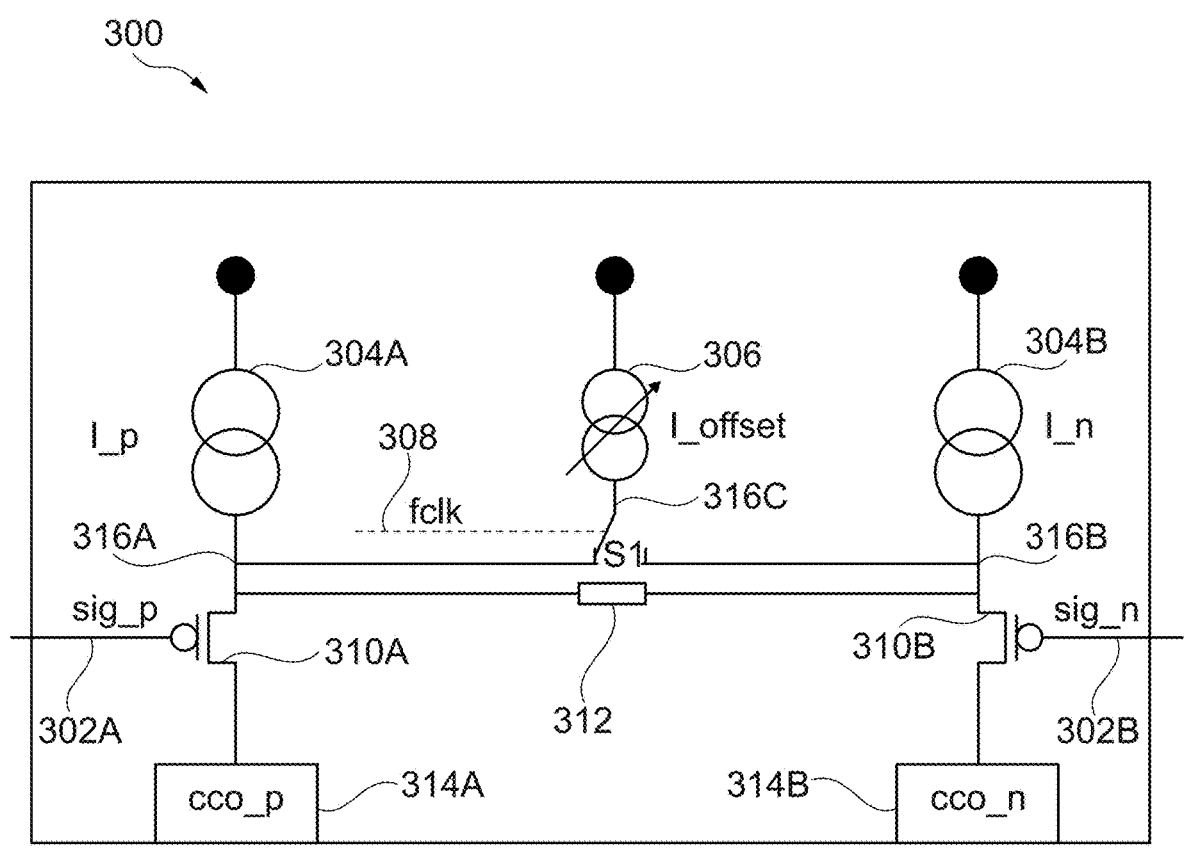
FIG. 3 is a circuit diagram of a switched current analog interface and current-controlled oscillators according to an embodiment.

FIG. 3 is a circuit diagram of a switched current analog interface and current-controlled oscillators 300 according to an embodiment, which is a specific example of the analog interface and controlled oscillators 200 shown in FIG. 2. Switched current analog interface and controlled oscillators 300 of FIG. 3 comprises a switched current source I_offset 306 that adds an offset current to the control input of the cco_p and cco_n oscillators 314A and 314B. The switching of the offset current 306 can be done in a static or dynamic manner. The switched current analog interface and current-controlled oscillators 300 can be used in a controlled oscillator ADC having improved locking characteristics.

The analog interface portion includes current sources I_p 304A, I_n 304B, and switched current source I_offset 306, switch S1, as well as P-channel transistors 310A and 310B and source resistor 312. In an embodiment, current source 304A is coupled between a positive voltage source and node 316A, current source 304B is coupled between a positive voltage source and node 316B, and current source 306 is coupled between a node coupled to a positive voltage source and node 316C. In embodiments, current sources 304A, 304B, and 306 can be high value resistors, current mirrors, or portions of current mirrors. Switch S1 can comprise first and second transistors, wherein a current path of the first transistor is coupled between node 316C and node 316A, and wherein a current path of the second transistor is coupled between node 316C and node 316B. A control terminal of the first transistor can directly receive the fclk signal at node 308, whereas a control terminal of the second transistor can receive an inverted copy of the fclk signal. In embodiments, the fclk signal can comprise a switched signal or a static signal, which will be explained in further detail below. In an embodiment, current sources 304A and 304B can be filtered current sources, whereas current source 306 is not filtered, at least in the switched embodiment. P-channel transistor 310A has a source coupled to node 316A, a gate coupled to node 302A for receiving the sig_p signal, and a drain coupled to the control input of current-controlled oscillator cco_p 314A. P-channel transistor 310B has a source coupled to node 316B, a gate coupled to node 302B for receiving the sign signal, and a drain coupled to the control input of current-controlled oscillator cco_n 314B. Whereas the analog differential input signal controls the amount of control current distributed between current-controlled oscillators 314A and 314B, the amount of offset current that is added to the control currents of current-controlled oscillators 314A and 314B is controlled by the logic state of the fclk signal. In an embodiment, the bandwidth of switch S1 should be greater than the fclk signal, which can be less than a system clock signal, fsystem. In an embodiment, source resistor 312 is coupled between the sources of transistors 310A and 310B (nodes 316A and 316B), and can be a high value resistor in an embodiment.

In the example of FIG. 3, current sources I_p and I_n (304A and 304B) are filtered currents for low noise operation. In the switched mode of operation current source I_offset (306) can not be easily filtered, and may contribute to additional flicker noise to the ADC. To reduce the additional flicker noise due to the switched offset current, current source 306 is alternatively switched to transistor 310A and transistor 310B. Since the frequency-to-digital converter 106 shown in FIG. 1 in the subsequent digital processing path afterwards includes integration and a subtraction between the two signal channels, some of the additional low frequency flicker noise is reduced. The switching of the offset current 306 generates a tone at fclk. If the frequency of the switching signal fclk is equal to the frequency of the sampling signal fsample no tone is ideally generated at the output of the controlled-current ADC. In an embodiment, the filtering of current sources 304A and 304B is performed by filtering a bias voltage of the current source output transistor used to implement the current sources. Typically, an RC lowpass filter can be used with a resistor (R) having a resistance range between one gigaohm and 100 gigaohms, and a capacitor (C) having a capacitance range between one picofarad and 20 picofarads to achieve a low cut off frequency (below the audio band frequency range). Alternatively, resistance and capacitance values outside of this range could be used depending on the particular system and its specifications.

The dynamic switching frequency (fclk) of switch S1 is derived from a fixed frequency sampling clock (fsample) rather than the free running oscillator clock (fosc). In embodiments, fclk can be made to be equal to fsample, fsample/2, fsample/4, or fsample/8. Multiples of fsample can also be used for the frequency of fclk. While the exact relationship between the switching frequency and the sampling frequency need not be fixed, it is advantageous to use a high frequency switching frequency in order not to interfere with the audio band signal.

A static current offset will generally not generate audible artefacts and may be used if the controlled oscillators input signals sig_p and sig_n do not receive a signal that cancels the static offset. In certain applications (for example, MEMS microphones) a large magnitude input signal can easily be attained if infrasound energy is captured by the MEMS microphone. Using a dynamic signal, however, a cancelation effect is less likely to occur. In some embodiments, static offset may be set to be significantly smaller than the available dynamic range of the analog interface to maintain a usable dynamic range.

Other signals can be used for switching the offset current 306. For example, complex signals such as pseudo random patterns and multi tone signals can be used to prevent locking between controlled oscillators 314A and 314B. The design of these complex switching signals should attempt to minimize energy in the audio band as much as possible and avoid situations in which the input signal cancels the disturb signal.

Figure 4:
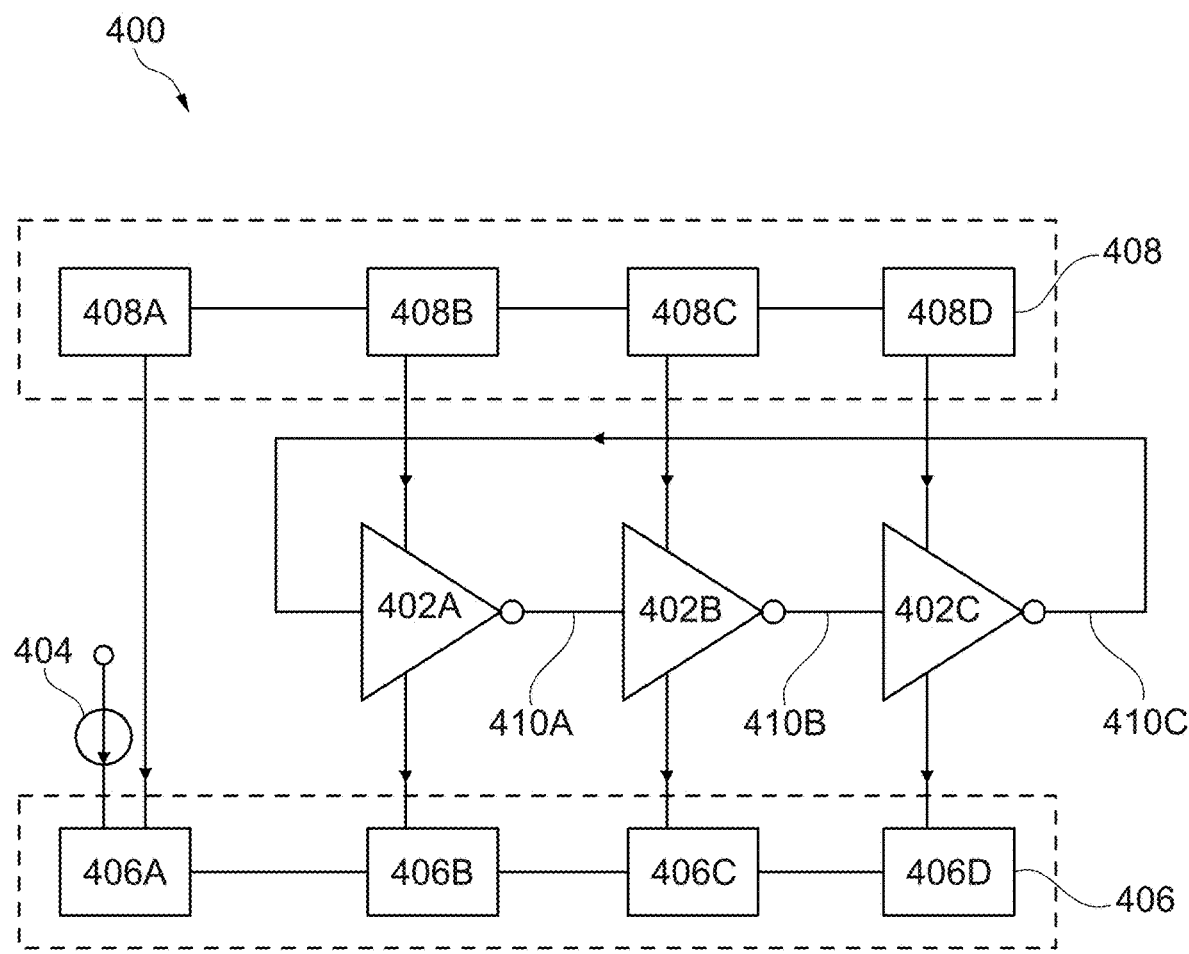
FIG. 4 is a block diagram of a current-controlled ring oscillator.

FIG. 4 is a block diagram of a current-controlled ring oscillator 400 that can be used for current-controlled oscillators 314A and 314B shown in FIG. 3. While a ring oscillator 400 is shown in FIG. 4, other types of current-controlled oscillators other than current-controlled ring oscillators can be used for current-controlled oscillators 314A and 314B shown in FIG. 3. Ring oscillator 400 comprises a ring of three inverters 402A, 402B, and 402C, wherein an output of an inverter is coupled to the input of a next inverter in the ring. The output of inverter 402A provides a first phase oscillator output 410A, the output of inverter 402B provides a second phase oscillator output 410B, and the output of inverter 402C provides a third phase oscillator output 410C. Any of the outputs can be used in an embodiment. While only three inverters are shown in FIG. 4, any odd number of inverters may be used. The frequency of operation of current-controlled ring oscillator 400 is controlled by the magnitude of the current provided by input current source 404. In an embodiment, current source 400 is the output current of transistors 310A or 310B shown in FIG. 3. The current from current source 404 is received by a current mirror 406 and a replica current is received by current mirror 408. Current mirror 406 includes current mirror portion 406A for receiving the input current and generating the replica current, current mirror portion 406B coupled to a bias input of inverter 402A, current mirror portion 406C coupled to a bias input of inverter 402B, and current mirror portion 406D coupled to a bias input of inverter 402C. In an embodiment, current mirror 406 can comprise coupled N-channel transistors. Current mirror 408 includes current mirror portion 408A for receiving the replica current, current mirror portion 408B coupled to a bias input of inverter 402A, current mirror portion 408C coupled to a bias input of inverter 402B, and current mirror portion 408D coupled to a bias input of inverter 402C. In an embodiment, current mirror 408 can comprise coupled P-channel transistors. While the currents associated with two bias inputs for each inverter are controlled in FIG. 4, other embodiments can control the current flowing into a first bias input and a second bias input can be coupled to ground or to a power supply voltage. Other implementations of a current-controlled ring oscillator can also be used.

Figure 5:
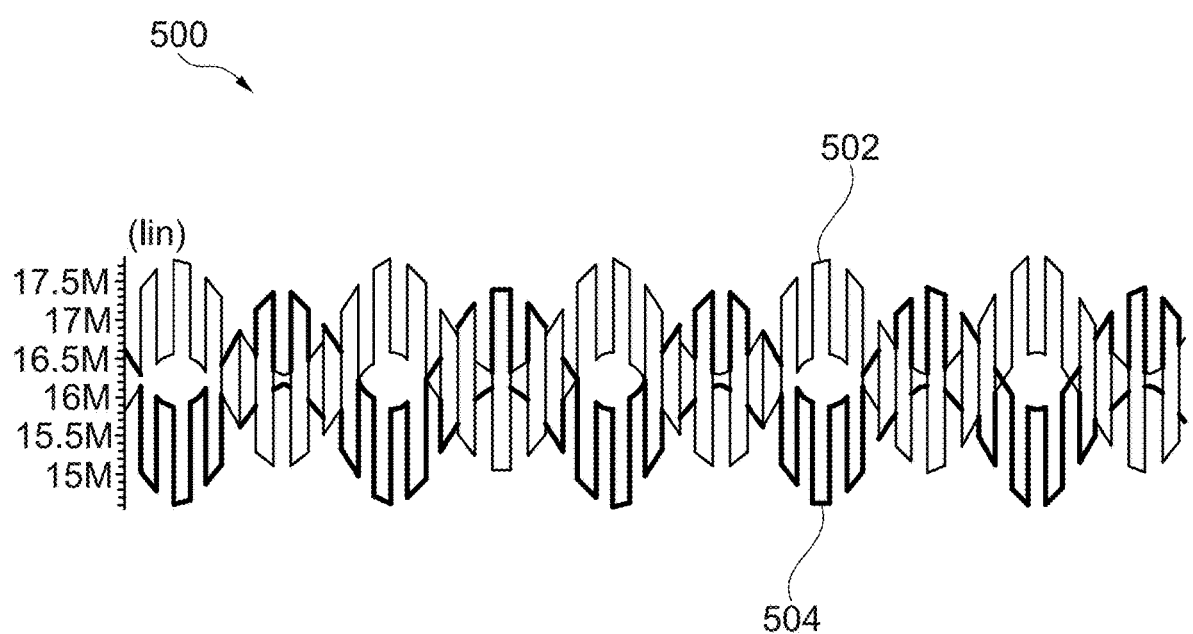
FIG. 5 is a combined waveform of the current output of two current-controlled oscillators illustrating a switched current offset between the two output currents.

FIG. 5 is a combined waveform 500 of the current output of two current-controlled oscillators illustrating a switched current offset between the two output currents. In an example, waveform 502 represents the frequency output waveform of current-controlled oscillator 314A (shown in FIG. 3) and waveform 504 represents the frequency output waveform of current-controlled oscillator 314B (shown in FIG. 3). The combined waveform 500 has arbitrary time units in the x-axis and arbitrary current units in the y-axis. In the example of FIG. 5, the analog differential input signal (sig_p−sig_n) is a sine wave. While waveforms 502 and 504 have a frequency component that is the same as the input signal, the switched current offset as shown minimizes the overlap between the output frequency signals (waveforms 502 and 504) and thus limits the potential locking time between the two current-controlled oscillators.

Figure 6:
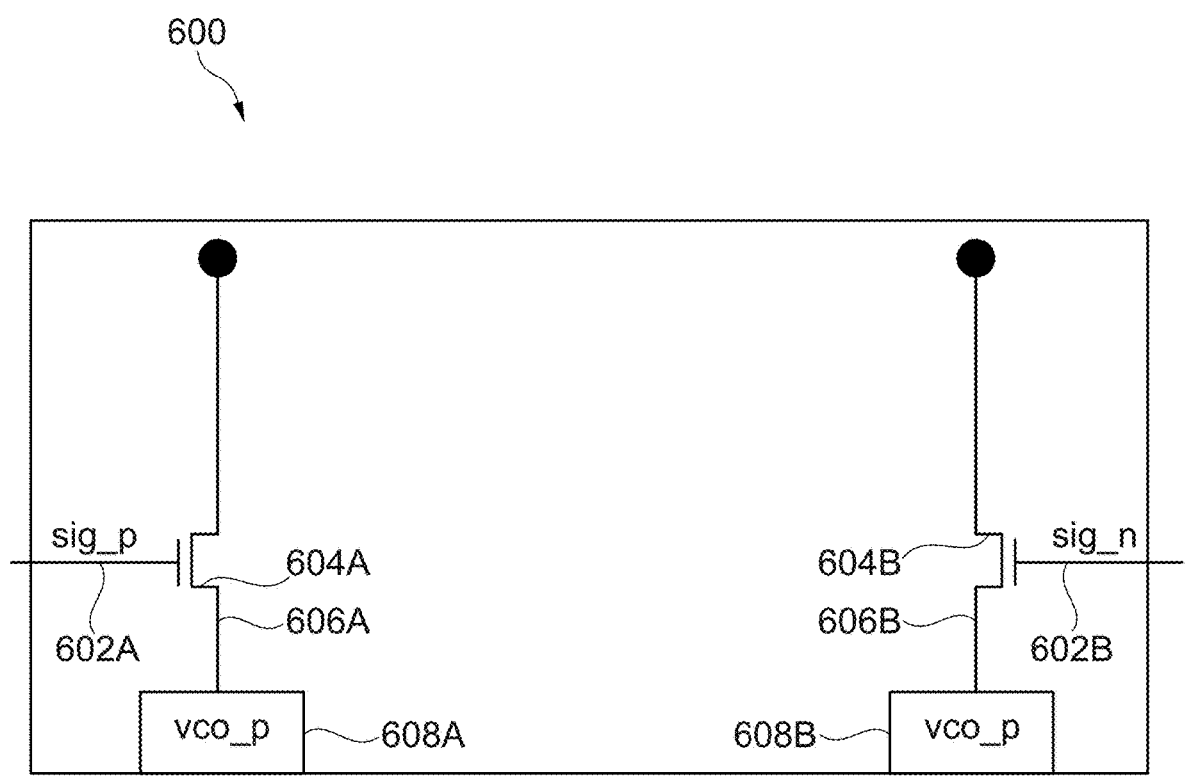
FIG. 6 is a circuit diagram of a switched voltage analog interface and voltage-controlled oscillators according to an embodiment.

FIG. 6 is a circuit diagram of a switched voltage analog interface and voltage-controlled oscillators 600 according to an embodiment. The analog interface includes transistor 604A having a drain coupled to a positive voltage source, a gate for receiving the sig_p input signal at node 602A, and a source for providing a voltage following the input signal at node 606A. The analog interface also includes transistor 604B having a drain coupled to a positive voltage source, a gate for receiving the sig_n input signal at node 602B, and a source for providing a voltage following the input signal at node 606B. A control input of voltage-controlled oscillator vco_p 608A is coupled to node 606A. A control input of voltage-controlled oscillator vco_n 608B is coupled to node 606B.

In the implementation of FIG. 6, the voltage (instead of the current) of each of the VCOs (voltage-controlled oscillators) 608A and 608B is set by controlling the input signal to the NMOS source follower transistors 604A and 604B. The operation of analog front end and VCOs 600 can be characterized by the following: sig_p=sig_n+V_offset; V_offset adds an offset to the control voltages at nodes 606A and 606B; and the control voltages at nodes 606A and 606B controls the frequency of each oscillator 608A and 608B.

As previously described with respect to the current offset, the voltage offset can be applied in a static or dynamic manner. For example, the voltage offset can comprise a periodic disturbance based on a clock signal, a complex signal, or a static offset. Transistors 604A and 604B can be N-channel or NMOS transistors configured in a source-follower configuration. Other follower circuits such as buffer circuits could also be used. Oscillators 608A and 608B are voltage-controlled oscillators in the embodiment of FIG. 6 and are described in further detail below with reference to FIG. 7. As previously described, nodes 606A and 606B are control nodes, wherein the voltage at these control nodes controls the output frequency of the oscillators 608A and 608B.

Figure 7:
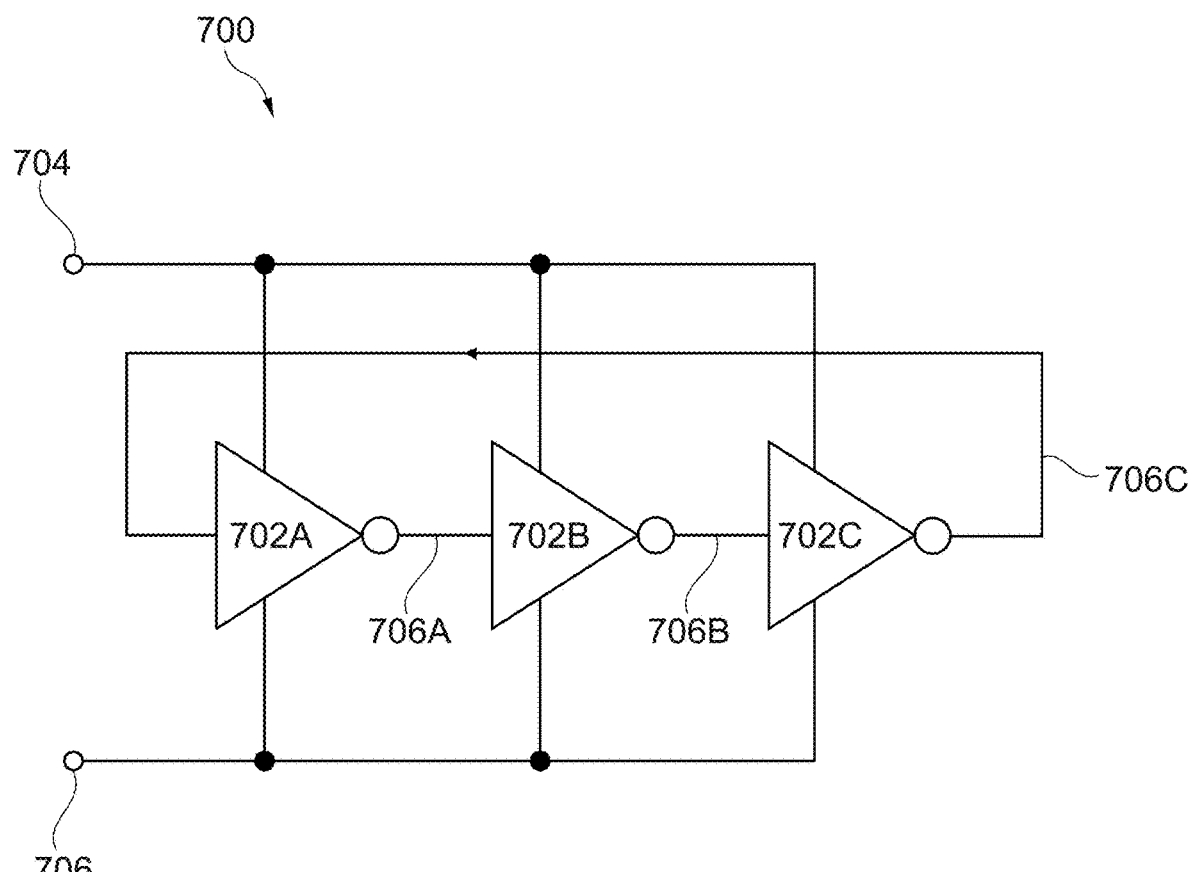
FIG. 7 is a block diagram of a voltage-controlled ring oscillator.

FIG. 7 is a block diagram of a voltage-controlled ring oscillator 700 that can be used for voltage-controlled oscillators 608A and 608B shown in FIG. 6. Ring oscillator 700 comprises a ring of three inverters 702A, 702B, and 702C, wherein an output of an inverter is coupled to the input of a next inverter in the ring. The output of inverter 702A provides a first phase oscillator output 706A, the output of inverter 702B provides a second phase oscillator output 706B, and the output of inverter 702C provides a third phase oscillator output 706C. Any of the outputs can be used in an embodiment. While only three inverters are shown in FIG. 7, any odd number of inverters may be used. The frequency of operation of voltage-controlled ring oscillator 700 is controlled by the magnitude of the voltage at bias nodes 704 and 706. In an embodiment, node 704 can comprise the control inputs at nodes 606A and 606B for receiving the control voltage from transistors 604A or 604B shown in FIG. 6. In an embodiment node 706 can be coupled to ground or to a negative voltage source. In other embodiments, nodes 704 and 706 can both comprise voltage control signals for changing the frequency of voltage-controlled ring oscillator 700.

Figure 8:
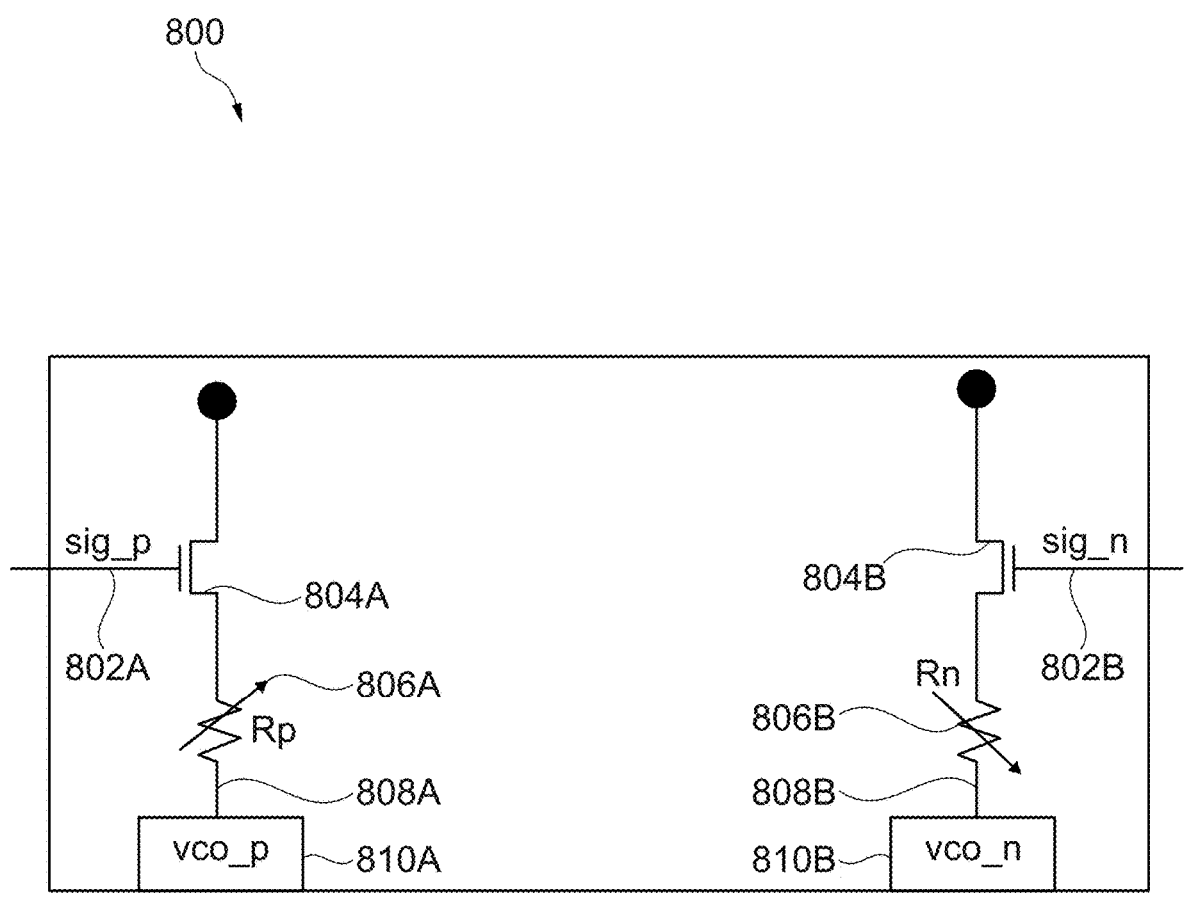
FIG. 8 is a block diagram of a variable resistance analog interface and voltage-controlled oscillators according to an embodiment.

FIG. 8 is a circuit diagram of a switched voltage analog interface and voltage-controlled oscillators 800 according to an embodiment. The analog interface includes transistor 804A having a drain coupled to a positive voltage source, a gate for receiving the sig_p input signal at node 802A, and a source for providing a voltage following the input signal at node 808A through intermediate variable resistor Rp 806A. The analog differential input signal across the analog interface is equal to sig_p−sig_n. The analog interface also includes transistor 804B having a drain coupled to a positive voltage source, a gate for receiving the sig_n input signal at node 802B, and a source for providing a voltage following the input signal at node 808B through intermediate variable resistor Rn 806B. A control input of voltage-controlled oscillator vco_p 810A is coupled to node 808A. A control input of voltage-controlled oscillator vco_n 810B is coupled to node 808B. An example of a variable resistor is further described below with reference to FIG. 9.

In the implementation of FIG. 8, the control voltage of each of the VCOs at nodes 808A and 808B is set by controlling the value of the variable resistors 806A and 806B coupled to the sources of transistors 804A and 804B, assuming that a constant current flows through each of the transistors. Changing the values of the variable resistors 806A and 806B changes the control voltages at nodes 808A and 808B and therefore controls the frequency of each voltage-controlled oscillator 810A and 810B. The difference between the control voltages at nodes 808A and 808B is equal to Voffset, which is achieved by increasing the value of one of the variable resistors with respect to the other of the two variable resistors, decreasing the value of one of the variable resistors with respect to the other of the two variable resistors, or increasing the value of one of the variable resistors while decreasing the value of the other of the two variable resistors. The programming of the resistor offset, and the corresponding voltage and frequency offset, can be implemented in either a static or dynamic fashion as previously described. For example, the voltage offset can comprise a periodic disturbance based on a clock signal, a complex signal, or a static offset.

In the embodiment of FIG. 8, transistors 804A and 804B are NMOS or N-channel transistors in the source follower configuration. Other source follower configurations or buffer amplifiers can also be used. The voltage at nodes 808A and 808B comprise the control voltages for each voltage-controlled oscillator 810A and 810B. Each voltage-controlled oscillator 810A and 810B can comprise a voltage-controlled oscillator 700 as previously described with respect to FIG. 7.

Figure 9:
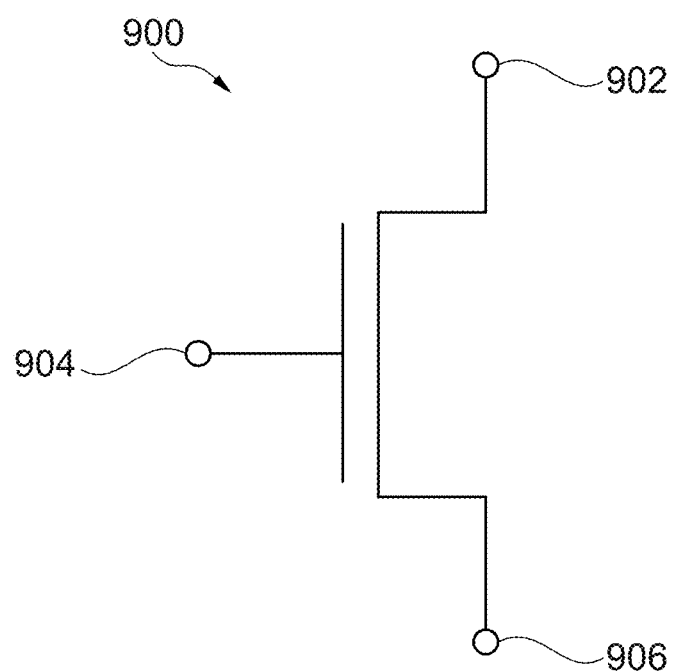
FIG. 9 is a schematic diagram of a variable resistor.

FIG. 9 is a schematic diagram of a variable resistor 900 suitable for use in the analog interface of FIG. 8. Variable resistor 900 comprises a transistor in an embodiment, wherein the resistance of the current path between nodes 902 and 906 is determined by the value of an analog control signal at control node 904. Variable resistor 900 can be controlled directly with an analog control signal or can be digitally programmed with a digital value and a digital-to-analog converter (not shown in FIG. 9). Variable resistor can comprise an N-channel or P-channel transistor, although other types of variable resistors can be used. For example, switchable resistor networks can be used instead of the transistor embodiment shown in FIG. 9.

Figure 10:
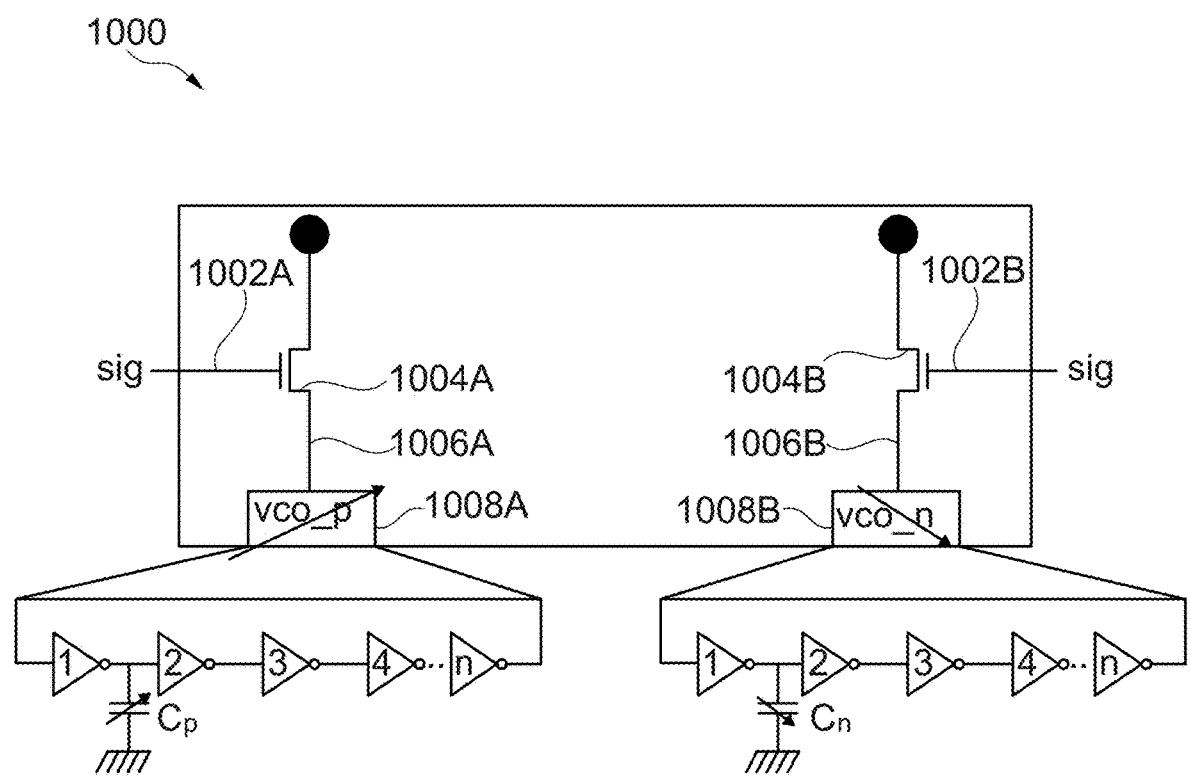
FIG. 10 is a circuit diagram of an analog interface and voltage-controlled oscillators including a varactor according to an embodiment.

FIG. 10 is a circuit diagram of an analog interface and voltage-controlled oscillators woo including a varactor according to an embodiment. To prevent locking between the voltage-controlled oscillators in the embodiment of FIG. 10 an oscillator load offset is introduced using load varactors into the oscillators as will be described in further detail below. The analog interface includes transistor 1004A having a drain coupled to a positive voltage source, a gate for receiving the single-ended sig input signal at node 1002A, and a source for providing a voltage following the input signal at node 1006A. The analog interface also includes transistor 1004B having a drain coupled to a positive voltage source, a gate for receiving the single-ended sig input signal at node 1002B, and a source for providing a voltage following the input signal at node 1006B. A control input of voltage-controlled oscillator vco_p 1008A is coupled to node 1006A. A control input of voltage-controlled oscillator vco_n 1008B is coupled to node 1006B. Transistors 1004A and 1004B can comprise N-channel transistors. Voltage-controlled oscillator vco_p 1008A includes an odd number of serially-coupled inverters 1, 2, 3, and 4 through "n", wherein "n" is an odd integer and a varactor load Cp coupled to a junction between two of the serially-coupled inverters. Voltage-controlled oscillator vco_n 1008B includes an odd number of serially-coupled inverters 1, 2, 3, and 4 through "n", wherein "n" is an odd integer and a varactor load Cn coupled to a junction between two of the serially-coupled inverters. An implementation of a varactor for use as an adjustable varactor load is described below with respect to FIG. 11.

In the implementation of FIG. 10, the frequency versus voltage characteristic of each of the voltage-controlled oscillators 1008A and 1008B is changed by changing a capacitive tuning load comprising varactors Cp and Cn. In the implementation of FIG. 10, a single-ended input signal sig and the same VCO control voltage at nodes 1006A and 1006B, each oscillator has a different oscillation frequency due to the different values of varactors Cp and Cn. Changing the values of the varactors (tuning capacitors) Cp and Cn changes the corresponding oscillation frequency. When Cp≠Cn, the oscillation frequency of vco_p 1008A is different from the oscillation frequency of vco_n 1008B. As previously described with respect to other embodiments, the programming of the varactors Cp and Cn can be accomplished either in a static or dynamic fashion.

Figure 11:
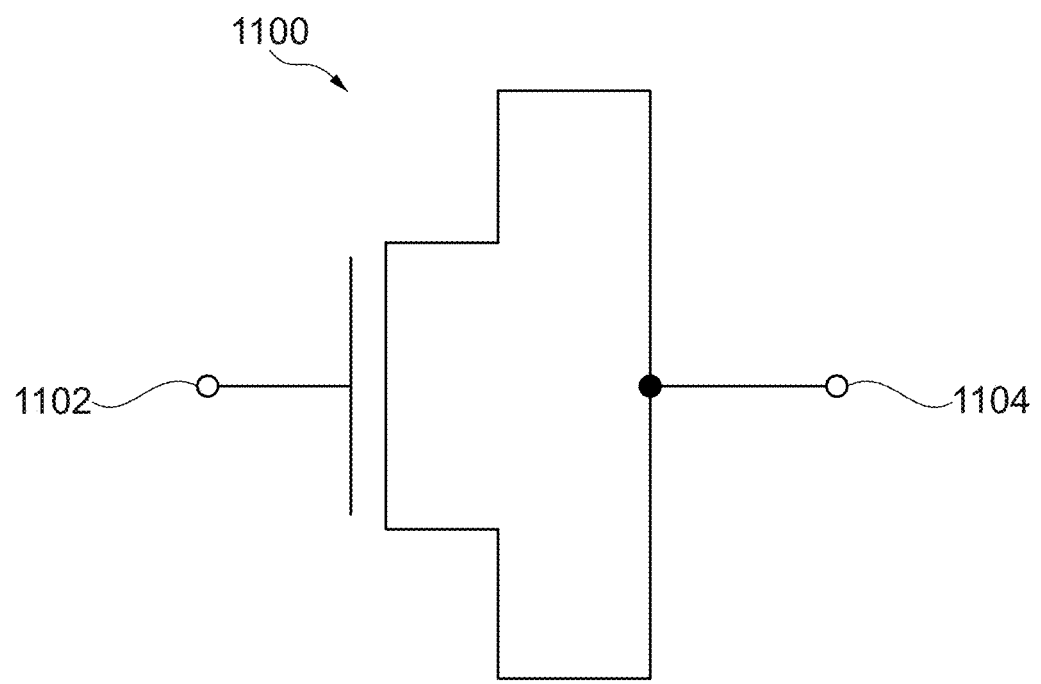
FIG. 11 is a schematic diagram of a varactor.

FIG. 11 is a schematic diagram of a varactor 1100 comprising a variable capacitor suitable for use in the voltage-controlled oscillators 1008A and 1008B of FIG. 10. Varactor 1100 comprises a transistor in an embodiment, having a control node 1102 and controlled current path nodes coupled to node 1104. The value of the capacitance of varactor 1100 is determined by the value of the voltage applied between nodes 1102 and 1104. Varactor 1100 can be controlled directly with an analog control signal or can be digitally programmed with a digital value and a digital-to-analog converter (not shown in Figure ii). Varactor 1100 can comprise an N-channel or P-channel transistor, although other types of variable capacitors can be used.

Figure 12:
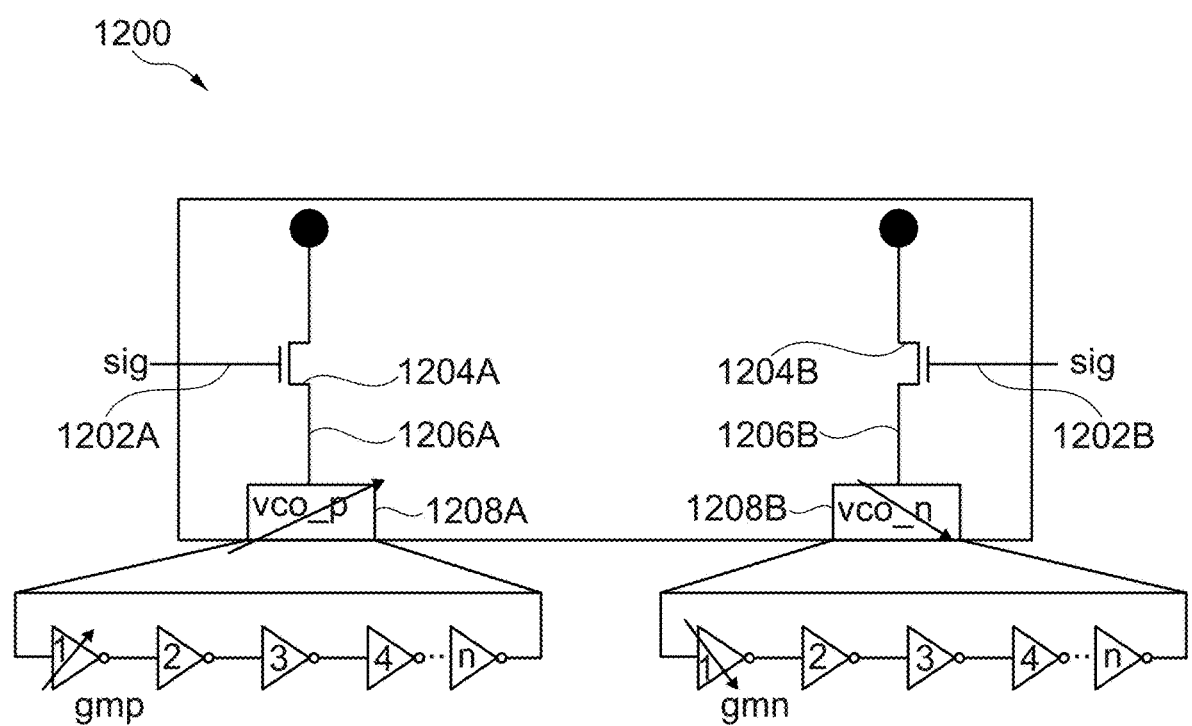
FIG. 12 is a circuit diagram of an analog interface and voltage-controlled oscillators including a variable transconductance according to an embodiment.

FIG. 12 is a circuit diagram of an analog interface and voltage-controlled oscillators 1200 including a variable transconductance according to an embodiment. To prevent locking between the voltage-controlled oscillators in the embodiment of FIG. 12 an oscillator strength offset is introduced using a variable transconductance of one or more inverters in the oscillators as will be described in further detail below. The analog interface includes transistor 1204A having a drain coupled to a positive voltage source, a gate for receiving the single-ended sig input signal at node 1202A, and a source for providing a voltage following the input signal at node 1206A. The analog interface also includes transistor 1204B having a drain coupled to a positive voltage source, a gate for receiving the single-ended sig input signal at node 1202B, and a source for providing a voltage following the input signal at node 1206B. A control input of voltage-controlled oscillator vco_p 1208A is coupled to node 1206A. A control input of voltage-controlled oscillator vco_n 1208B is coupled to node 1206B. Transistors 1204A and 1204B can comprise N-channel transistors. Voltage-controlled oscillator vco_p 1208A includes an odd number of serially-coupled inverters 1, 2, 3, and 4 through "n", wherein "n" is an odd integer, wherein at least one of the inverters comprises a variable transconductance gmp. Voltage-controlled oscillator vco_n 1208B includes an odd number of serially-coupled inverters 1, 2, 3, and 4 through "n", wherein "n" is an odd integer, wherein at least one of the inverters comprises a variable transconductance gmn. An implementation of a variable transconductance ring oscillator for use as in realizing a variable oscillator strength offset is described below with respect to FIG. 13.

In the implementation of FIG. 12, the frequency versus voltage characteristic of each of the voltage-controlled oscillators 1208A and 1208B is changed by tuning the effective strength of one (or more) of the inverters in each VCO. In the implementation of FIG. 12, a single-ended input signal sig and the same VCO control voltage at nodes 1206A and 1206B, each oscillator has a different oscillation frequency due to the different values of transconductances gmp and gmn. Changing the transconductances gmp and gmn of one (or more) of the inverter stages, changes the oscillation frequency of each of the oscillators 1208A and 1208B. With gmp≠gmn, the oscillation frequency of vco_p 1208A is different from the oscillation frequency of vco_n 1208B. As previously described, the programming of variable transconductances gmp and gmn can be performed in either a static or dynamic fashion.

Figure 13:
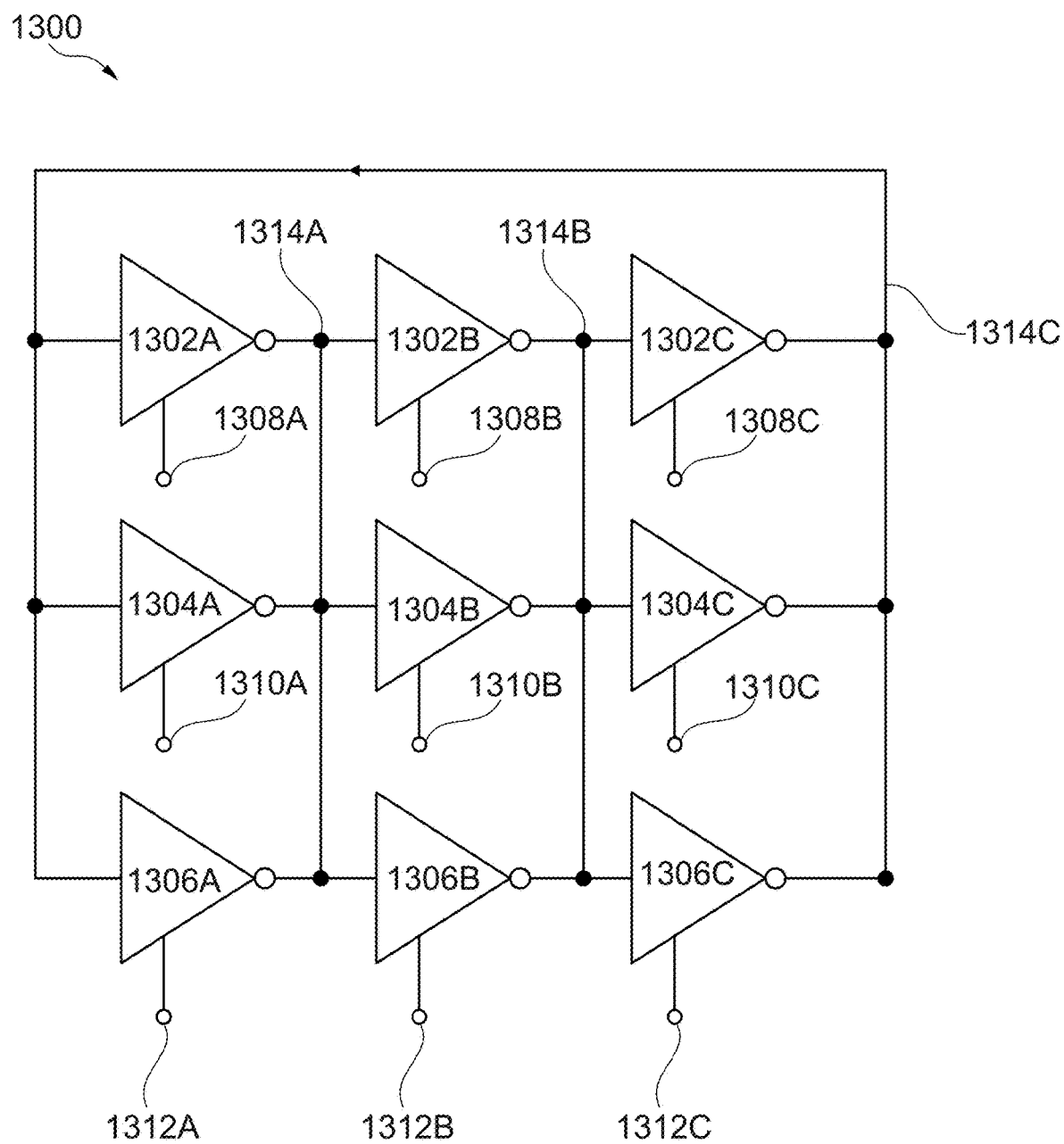
FIG. 13 is a block diagram of a variable transconductance ring oscillator.

FIG. 13 is a schematic diagram of a variable transconductance ring oscillator 1300 comprising a plurality of tri-stated inverters. In an embodiment, ring oscillator 1300 comprises a digital implementation example that tunes the delay of each inverter using a Digitally Controlled Ring Oscillator (DCRO). Ring oscillator 1300 includes a first ring of serially-coupled inverters 1302A, 1302B, and 1302C, wherein the output of an inverter is coupled to the input of a subsequent inverter in the ring. Ring oscillator includes a first phase output node 1314A, a second phase output node 1314B, and a third phase output node 1314C. Any of the output nodes can be used as the output of ring oscillator 1300. Each inverter 1302A, 1302B, and 1302C comprises a tri-state inverter that can be tri-stated through corresponding bias control nodes 1308A, 1308B and 1308C. Ring oscillator 1300 includes a second ring of serially-coupled inverters 1304A, 1304B, and 1304C, wherein the output of an inverter is coupled to the input of a subsequent inverter in the ring. The output of inverter 1304A is coupled to the first phase output node 1314A, the output of inverter 1304B is coupled to the second phase output node 1314B, and the output of inverter 1304C is coupled to the third phase output node 1314C. Each inverter 1304A, 1304B, and 1304C comprises a tri-state inverter that can be tri-stated through corresponding bias control nodes 1310A, 1310B and 1310C. Ring oscillator 1300 includes a third ring of serially-coupled inverters 1306A, 1306B, and 1306C, wherein the output of an inverter is coupled to the input of a subsequent inverter in the ring. The output of inverter 1306A is coupled to the first phase output node 1314A, the output of inverter 1306B is coupled to the second phase output node 1314B, and the output of inverter 1306C is coupled to the third phase output node 1314C. Each inverter 1306A, 1306B, and 1306C comprises a tri-state inverter that can be tri-stated through corresponding bias control nodes 1312A, 1312B and 1312C. While three rings of serially-coupled inverters and three inverters per ring are shown in FIG. 13, any number of rings or any number of odd integer inverters can be used. Not all of the inverters need to have a tri-state control node in embodiments.

In operation, the transconductance of an equivalent inverter can be programmed by selectively programming the tri-state control input of individual parallel inverters. For example, an equivalent inverter can include individual parallel inverters 1302A, 1304A, and 1306A. The transconductance of the equivalent inverter can be changed from a first value wherein only one of the inverters is active (not tri-stated) to a second value wherein two or three of the inverters are active (not tri-stated). The delay of each equivalent inverter will also corresponding change between a first value and a second value. In this manner, the output frequency of oscillator 1300 will change between a first value frequency and a second value frequency corresponding to the first transconductance value or first delay value and the second transconductance value or second delay value. Similar programming adjustments can be made using other tri-state control inputs of other parallel inverters shown in oscillator 130o.

Figure 14:
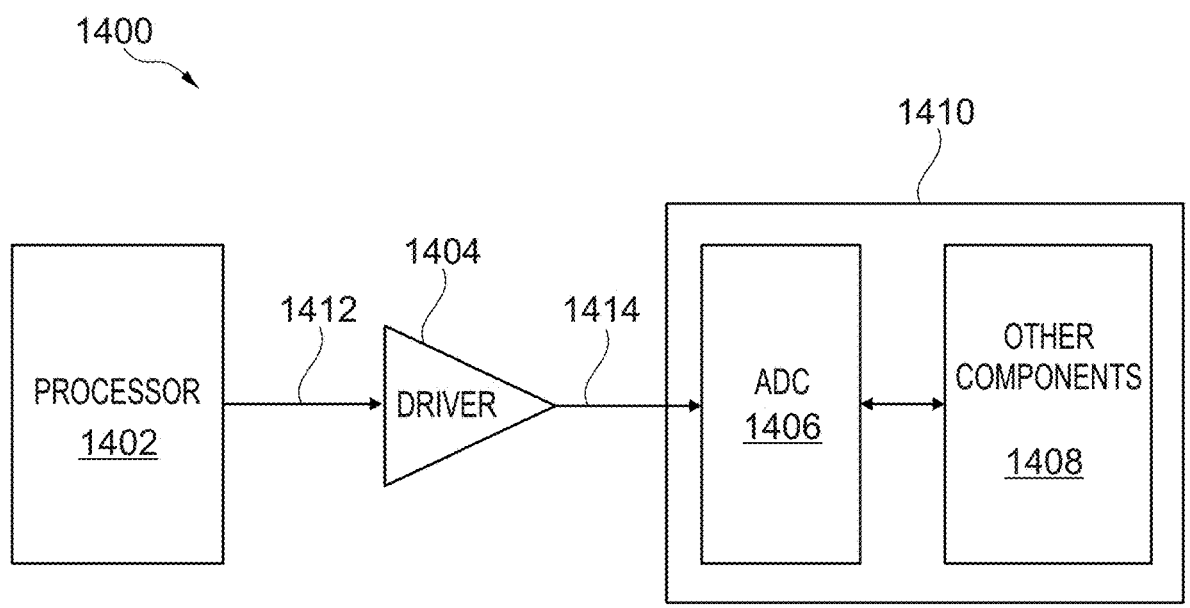
FIG. 14 is a system diagram including a controlled oscillator ADC according to an embodiment.

FIG. 14 is a system diagram including a controlled oscillator ADC system 1400 according to an embodiment. Controlled oscillator ADC system 1400 includes a processor 1402 that can be used for generating control and clock signals on digital bus 1412. A driver 1404 is coupled to digital bus 1412 and generates driven analog control signals and digital clock signals on bus 1414. ADC 1406 receives the control and clock signals from bus 1414 as well as other signals from other components 1408. For example, in a MEMS microphone application, a MEMS microphone component can provide analog signals received by controlled oscillator ADC 1406. The output of ADC 1406 can be further processed by additional digital and analog signal processing components in embodiments. System 1400 can be realized in one or more integrated circuits. The system shown in FIG. 14 can be adapted to many applications not limited to the MEMS microphone application.

Figure 15:
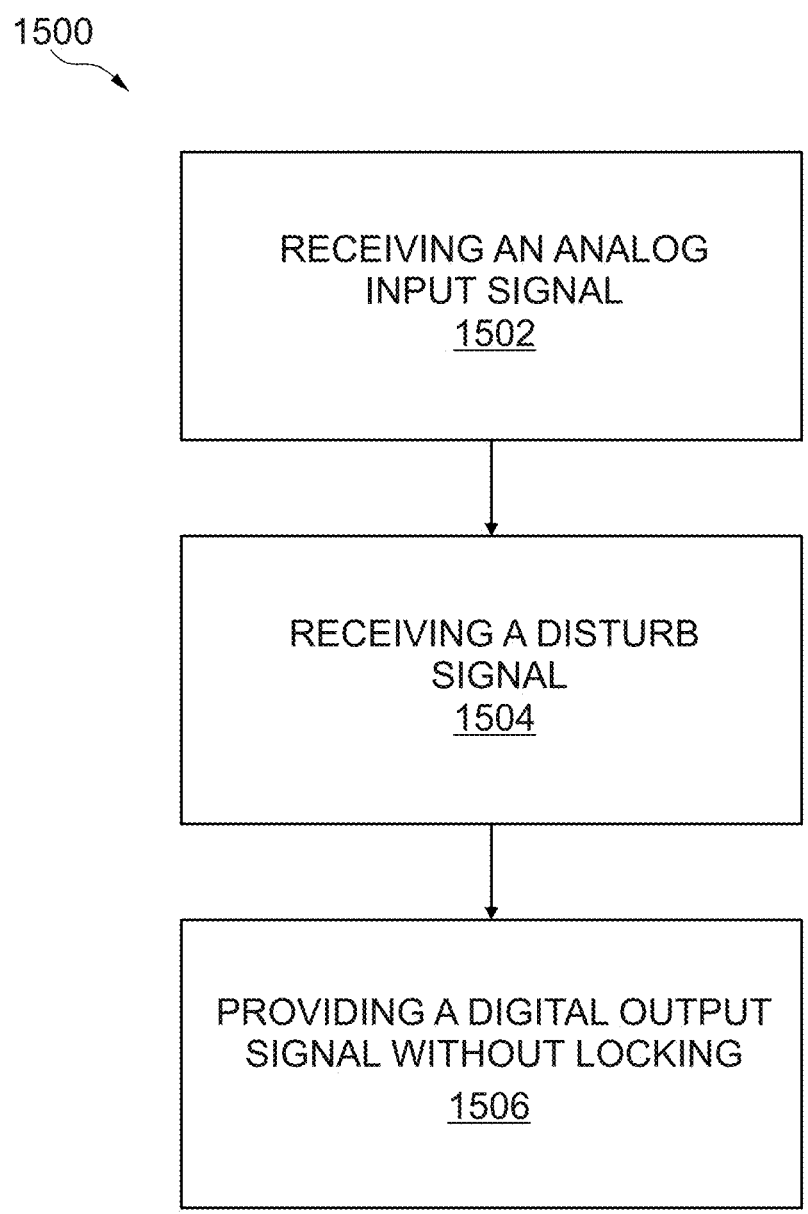
FIG. 15 is a block diagram of a method of operating a controlled oscillator ADC according to an embodiment.

FIG. 15 is a block diagram 1500 of a method of operating a controlled oscillator ADC according to an embodiment. A method of operating a converter comprising two controlled oscillators, can include receiving an analog input signal at an input of the converter at step 1502; providing a digital output signal proportional to the analog input signal at an output of the converter at step 1506; and providing at least one disturb signal to an analog interface of the converter or to at least one of the two controlled oscillators to prevent locking of the two controlled oscillators at step 1504. In an embodiment, step 1504 of providing the at least one disturb signal can comprise providing a current offset to the analog interface of the converter. In an embodiment, step 1504 of providing the at least one disturb signal can comprise adding a voltage offset to the analog input signal. In an embodiment, step 1504 of providing the at least one disturb signal can comprise providing the at least one disturb signal to a control input of a programmable resistor coupled to at least one of the two controlled oscillators. In an embodiment, step 1504 of providing the at least one disturb signal can comprise providing the at least one disturb signal to a control input of a varactor of at least one of the two controlled oscillators. In an embodiment, step 1504 of providing the at least one disturb signal can comprise providing the at least one disturb signal to a control input of a variable transconductance of at least one of the two controlled oscillators.

Example embodiments of the present invention are summarized here. Other embodiments can also be understood from the entirety of the specification and the claims filed herein.

Example 1. According to an embodiment, a controlled oscillator Analog-to-Digital Converter (ADC) includes an analog interface configured for receiving an analog input signal, and configured for providing a control signal; first and second controlled oscillators configured for receiving the control signal; and a frequency-to-digital converter having a first input coupled to an output of the first controlled oscillator, a second input coupled to an output of the second controlled oscillator, and an output for providing a digital output signal proportional to the analog input signal, wherein the analog interface or at least one of the first and second controlled oscillators is configured for receiving at least one disturb signal to prevent locking between the first and second controlled oscillators.

Example 2. The ADC of Example 1, wherein the analog interface comprises an offset current configured for receiving the at least one disturb signal.

Example 3. The ADC of any of the above examples, wherein the at least one disturb signal comprises a voltage offset of the analog input signal.

Example 4. The ADC of any of the above examples, wherein the analog interface comprises at least one programmable resistor configured for receiving the at least one disturb signal.

Example 5. The ADC of any of the above examples, wherein at least one of the first and second controlled oscillators comprises a varactor configured for receiving the at least one disturb signal.

Example 6. The ADC of any of the above examples, wherein at least one of the first and second controlled oscillators comprises a variable transconductance configured for receiving the at least one disturb signal.

Example 7. The ADC of any of the above examples, wherein the at least one disturb signal comprises a periodic signal.

Example 8. The ADC of any of the above examples, wherein the at least one disturb signal comprises a static signal.

Example 9. According to an embodiment, a circuit includes an analog interface comprising a first transistor having a control terminal for receiving a first input signal and a controlled terminal for providing a first control signal, and a second transistor having a control terminal for receiving a second input signal and a controlled terminal for providing a second control signal; a first controlled ring oscillator having a first input for receiving the first control signal and a first output for providing a first output signal; and a second controlled ring oscillator having a second input for receiving the second control signal and a second output for providing a second output signal, wherein the analog interface or at least one of the first and second controlled ring oscillators is configured for receiving at least one disturb signal to prevent locking between the first and second controlled ring oscillators.

Example 10. The circuit of Example 9, wherein the analog interface comprises a first filtered current source coupled to the first transistor, a second filtered current source coupled to the second transistor, and wherein the at least one disturb signal comprises a switchable unfiltered offset current selectively coupled to the first and second filtered current sources.

Example 11. The circuit of any of the above examples, wherein the at least one disturb signal comprises a voltage offset added to at least one of the first input signal or the second input signal.

Example 12. The circuit of any of the above examples, wherein the analog interface comprises a first programmable resistor interposed between the controlled terminal of the first transistor and the first input of the first controlled ring oscillator, a second programmable resistor interposed between the controlled terminal of the second transistor and the second input of the second controlled ring oscillator, and wherein the first programmable resistor or the second programmable resistor comprises a control input for receiving the at least one disturb signal.

Example 13. The circuit of any of the above examples, wherein at least one of the first and second controlled ring oscillators comprises a varactor having a control input for receiving the at least one disturb signal.

Example 14. The circuit of any of the above examples, wherein at least one of the first and second controlled ring oscillators comprises an inverter having a variable transconductance, the inverter having a control input for receiving the at least one disturb signal.

Example 15. According to an embodiment, a method of operating a converter comprising two controlled oscillators includes receiving an analog input signal at an input of the converter; providing a digital output signal proportional to the analog input signal at an output of the converter; and providing at least one disturb signal to an analog interface of the converter or to at least one of the two controlled oscillators to prevent locking of the two controlled oscillators.

Example 16. The method of any of the above examples, wherein providing the at least one disturb signal comprises providing a current offset to the analog interface of the converter.

Example 17. The method of any of the above examples, wherein providing the at least one disturb signal comprises adding a voltage offset to the analog input signal.

Example 18. The method of any of the above examples, wherein providing the at least one disturb signal comprises providing the at least one disturb signal to a control input of a programmable resistor coupled to at least one of the two controlled oscillators.

Example 19. The method of any of the above examples, wherein providing the at least one disturb signal comprises providing the at least one disturb signal to a control input of a varactor of at least one of the two controlled oscillators.

Example 20. The method of any of the above examples, wherein providing the at least one disturb signal comprises providing the at least one disturb signal to a control input of a variable transconductance of at least one of the two controlled oscillators.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A controlled oscillator Analog-to-Digital Converter (ADC) comprising:
    an analog interface configured for receiving an analog input signal, and configured for providing a control signal;
    first and second controlled oscillators configured for receiving the control signal; and
    a frequency-to-digital converter having a first input coupled to an output of the first controlled oscillator, a second input coupled to an output of the second controlled oscillator, and an output for providing a digital output signal proportional to the analog input signal,
    wherein the analog interface or at least one of the first and second controlled oscillators is configured for receiving at least one disturb signal to prevent locking between the first and second controlled oscillators.

2. The ADC of claim 1, wherein the analog interface comprises an offset current configured for receiving the at least one disturb signal.

3. The ADC of claim 1, wherein the at least one disturb signal comprises a voltage offset of the analog input signal.

4. The ADC of claim 1, wherein the analog interface comprises at least one programmable resistor configured for receiving the at least one disturb signal.

5. The ADC of claim 1, wherein at least one of the first and second controlled oscillators comprises a varactor configured for receiving the at least one disturb signal.

6. The ADC of claim 1, wherein at least one of the first and second controlled oscillators comprises a variable transconductance configured for receiving the at least one disturb signal.

7. The ADC of claim 1, wherein the at least one disturb signal comprises a periodic signal.

8. The ADC of claim 1, wherein the at least one disturb signal comprises a static signal.

9. A circuit comprising:
    an analog interface comprising a first transistor having a control terminal for receiving a first input signal and a controlled terminal for providing a first control signal, and a second transistor having a control terminal for receiving a second input signal and a controlled terminal for providing a second control signal;
    a first controlled ring oscillator having a first input for receiving the first control signal and a first output for providing a first output signal; and
    a second controlled ring oscillator having a second input for receiving the second control signal and a second output for providing a second output signal,
    wherein the analog interface or at least one of the first and second controlled ring oscillators is configured for receiving at least one disturb signal to prevent locking between the first and second controlled ring oscillators.

10. The circuit of claim 9, wherein the analog interface comprises a first filtered current source coupled to the first transistor, a second filtered current source coupled to the second transistor, and wherein the at least one disturb signal comprises a switchable unfiltered offset current selectively coupled to the first and second filtered current sources.

11. The circuit of claim 9, wherein the at least one disturb signal comprises a voltage offset added to at least one of the first input signal or the second input signal.

12. The circuit of claim 9, wherein the analog interface comprises a first programmable resistor interposed between the controlled terminal of the first transistor and the first input of the first controlled ring oscillator, a second programmable resistor interposed between the controlled terminal of the second transistor and the second input of the second controlled ring oscillator, and wherein the first programmable resistor or the second programmable resistor comprises a control input for receiving the at least one disturb signal.

13. The circuit of claim 9, wherein at least one of the first and second controlled ring oscillators comprises a varactor having a control input for receiving the at least one disturb signal.

14. The circuit of claim 9, wherein at least one of the first and second controlled ring oscillators comprises an inverter having a variable transconductance, the inverter having a control input for receiving the at least one disturb signal.

15. A method of operating a converter comprising two controlled oscillators, the method comprising:
    receiving an analog input signal at an input of the converter;
    providing a digital output signal proportional to the analog input signal at an output of the converter; and
    providing at least one disturb signal to an analog interface of the converter or to at least one of the two controlled oscillators to prevent locking of the two controlled oscillators.

16. The method of claim 15, wherein providing the at least one disturb signal comprises providing a current offset to the analog interface of the converter.

17. The method of claim 15, wherein providing the at least one disturb signal comprises adding a voltage offset to the analog input signal.

18. The method of claim 15, wherein providing the at least one disturb signal comprises providing the at least one disturb signal to a control input of a programmable resistor coupled to at least one of the two controlled oscillators.

19. The method of claim 15, wherein providing the at least one disturb signal comprises providing the at least one disturb signal to a control input of a varactor of at least one of the two controlled oscillators.

20. The method of claim 15, wherein providing the at least one disturb signal comprises providing the at least one disturb signal to a control input of a variable transconductance of at least one of the two controlled oscillators.

* * * * *